United States Patent
Cai et al.

(10) Patent No.: US 11,093,322 B1
(45) Date of Patent: Aug. 17, 2021

(54) MEMORY ERROR RECOVERY USING SHARED STRUCTURAL ELEMENT ERROR CORRELATIONS

(71) Applicant: Facebook, Inc., Menlo Park, CA (US)

(72) Inventors: Yu Cai, Palo Alto, CA (US); Daniel Henry Morris, Palo Alto, CA (US)

(73) Assignee: Facebook, Inc., Menlo Park, CA (US)

( * ) Notice: Subject to any disclaimer, the term of this patent is extended or adjusted under 35 U.S.C. 154(b) by 94 days.

(21) Appl. No.: 16/552,594

(22) Filed: Aug. 27, 2019

(51) Int. Cl.
| | |
|---|---|
| *G11C 29/00* | (2006.01) |
| *G06F 11/10* | (2006.01) |
| *H03M 13/11* | (2006.01) |
| *G11C 29/42* | (2006.01) |
| *G11C 16/08* | (2006.01) |

(52) U.S. Cl.
CPC ...... *G06F 11/1016* (2013.01); *G06F 11/1068* (2013.01); *G11C 16/08* (2013.01); *G11C 29/42* (2013.01); *H03M 13/1108* (2013.01); *H03M 13/1111* (2013.01)

(58) Field of Classification Search
None
See application file for complete search history.

(56) References Cited

U.S. PATENT DOCUMENTS

| | | | | |
|---|---|---|---|---|
| 2013/0238955 A1* | 9/2013 | D'Abreu | ............... | G11C 29/04 714/763 |
| 2014/0068384 A1* | 3/2014 | Kwak | ............... | G06F 11/1068 714/773 |
| 2016/0034344 A1* | 2/2016 | Hoekstra | ............. | G06F 11/1048 714/764 |
| 2016/0147582 A1* | 5/2016 | Karakulak | ............ | G06F 11/073 714/37 |
| 2019/0273512 A1* | 9/2019 | Chen | ................. | H03M 13/1108 |

\* cited by examiner

*Primary Examiner* — Guerrier Merant
(74) *Attorney, Agent, or Firm* — Van Pelt, Yi & James LLP

(57) ABSTRACT

A determination is made that bit errors of a selected data chunk stored in a computer memory are unable to be completely corrected using an initial error correction scheme. A plurality of other data chunks sharing a physical layout structure element of the computer memory with the selected data chunk is analyzed to identify one or more likely bit error locations of the selected data chunk aligned with one or more corresponding bit error locations of a threshold number of the analyzed other data chunks. An attempt is made to correct the bit errors of the selected data chunk based on the identified one or more likely bit error locations of the selected data chunk.

20 Claims, 7 Drawing Sheets

MEMORY ERROR RECOVERY USING SHARED STRUCTURAL ELEMENT ERROR CORRELATIONS

BACKGROUND OF THE INVENTION

Computer memory, oftentimes referred to as main memory, primary storage, or simply memory, is computer hardware that stores information for immediate use in a computer. Common examples of computer memory include dynamic random-access memory (DRAM), flash memory, and various other memory types. DRAM is an example of volatile memory, storage that maintains its data only while the storage is powered. Flash memory is an example of non-volatile memory, storage that has the capability to hold saved data even if the power is turned off. Various memory types are organized as addressable arrays of memory cells, with each memory cell storing one bit (0 or 1) of information.

BRIEF DESCRIPTION OF THE DRAWINGS

Various embodiments of the invention are disclosed in the following detailed description and the accompanying drawings.

DETAILED DESCRIPTION

Figure 1:
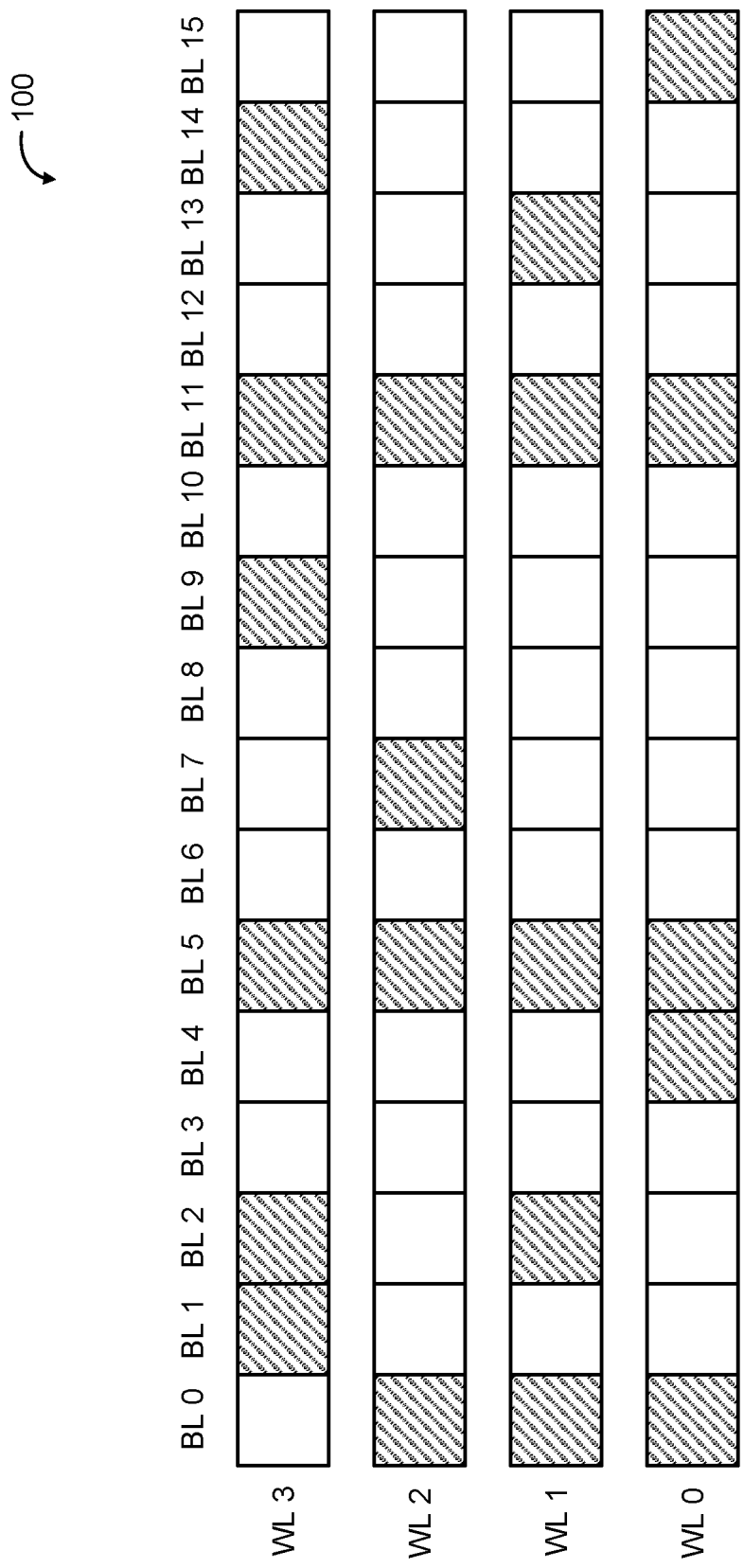
FIG. 1 is a diagram illustrating an example of a portion of a memory array.

The invention can be implemented in numerous ways, including as a process; an apparatus; a system; a composition of matter; a computer program product embodied on a computer readable storage medium; and/or a processor, such as a processor configured to execute instructions stored on and/or provided by a memory coupled to the processor. In this specification, these implementations, or any other form that the invention may take, may be referred to as techniques. In general, the order of the steps of disclosed processes may be altered within the scope of the invention. Unless stated otherwise, a component such as a processor or a memory described as being configured to perform a task may be implemented as a general component that is temporarily configured to perform the task at a given time or a specific component that is manufactured to perform the task. As used herein, the term 'processor' refers to one or more devices, circuits, and/or processing cores configured to process data, such as computer program instructions.

A detailed description of one or more embodiments of the invention is provided below along with accompanying figures that illustrate the principles of the invention. The invention is described in connection with such embodiments, but the invention is not limited to any embodiment. The scope of the invention is limited only by the claims and the invention encompasses numerous alternatives, modifications and equivalents. Numerous specific details are set forth in the following description in order to provide a thorough understanding of the invention. These details are provided for the purpose of example and the invention may be practiced according to the claims without some or all of these specific details. For the purpose of clarity, technical material that is known in the technical fields related to the invention has not been described in detail so that the invention is not unnecessarily obscured.

Memory error recovery is disclosed. A determination is made that bit errors of a selected data chunk stored in a computer memory are unable to be completely corrected using an initial error correction scheme. A plurality of other data chunks sharing a physical layout structure element of the computer memory with the selected data chunk is analyzed to identify one or more likely bit error locations of the selected data chunk aligned with one or more corresponding bit error locations of a threshold number of the analyzed other data chunks. An attempt is made to correct the bit errors of the selected data chunk based on the identified one or more likely bit error locations of the selected data chunk. Practical and technological benefits of the techniques disclosed herein include more reliable, higher storage capacity, and lower cost computer memory. The techniques disclosed herein can be applied within existing error recovery schemes, e.g., redundant array of independent disks (RAID). The techniques disclosed herein can be used to avoid the expense and time associated with RAID and other error recovery schemes. Furthermore, the techniques disclosed herein can be applied when all existing error recovery schemes have been tried, e.g., if a RAID scheme fails.

Various types of computer memory (also referred to herein as memory), such as DRAM, flash memory, and other types of memory, are organized as addressable arrays in which the arrays are formed by rows (referred to as wordlines) and columns (referred to as bitlines) of memory cells. See FIG. 1 for an example of a block of memory cells (organized along wordlines and bitlines) from a memory array. For DRAM, example memory cell implementations include single-transistor, three-transistor, and other designs. For flash memory, example memory cell implementations include NOR, NAND, and other designs. Flash memory cells may be organized in three-dimensional layers (e.g., 3D NAND) as well as more traditional two-dimensional planar arrangements. Reading of data from memory typically produces a row (wordline) of data, which can be a large amount of data (e.g., approximately 16-32 kilobytes).

Many computer memory types (e.g., DRAM, flash memory, etc.) are compatible with error correction code (ECC) (also referred to as error-correcting code) use to perform memory recovery (e.g., correct internal data corruption). ECC examples include block codes, convolutional codes, low-density parity-check (LDPC) codes, turbo codes, etc. ECC algorithms based on these codes can be used to recover data with bit errors. LDPC is an example of soft decoding in which data is decoded based at least in part on probabilistic information concerning data values. An ECC engine in the memory controller for the computer memory can correct errors in chunks of data. However, typically, after a memory controller has been implemented on an integrated circuit, such as being hardcoded as an application-specific integrated circuit (ASIC), the maximum number of errors the ECC engine can correct in a chunk of data (of a specified size) is fixed (e.g., because the ECC check matrix has been hardcoded). If the number of errors in the chunk of data exceeds this maximum number, the ECC engine is not able to perform memory recovery. Thus, it would be useful to develop techniques whereby memory recovery is possible even if the number of errors in the data chunk exceeds the maximum number correctable using the ECC engine alone.

As is described in further detail herein, in various embodiments, information about the type and location of physical errors (faults) in a first memory location is inferred by reading and correcting data in other (e.g., neighboring) memory locations. As used herein, neighboring locations can refer to locations within a specified vicinity as well as directly adjacent locations. Faults can cluster on a shared physical layout structure element, such as a bitline. Typically, failing bitline locations are not known, particularly if there are multiple failing locations. In some embodiments, a memory controller reads neighboring memory locations and performs error detection using ECC hardware. The error detection results can be used to detect physical failure points that affect the first memory location, which has data that is initially unrecoverable. This failure location information can be fed back to the ECC hardware to allow for recovery of the initially unrecoverable data. Thus, as is described in further detail herein, in various embodiments, likely bit error location inference is performed and then leveraged to recover initially unrecoverable data. This prevents permanent loss of user data or time-consuming and expensive disaster recovery procedures (if disaster recovery is available).

FIG. 1 is a diagram illustrating an example of a portion of a memory array. In memory portion 100, each square represents a memory cell. The example of FIG. 1 illustrates a memory portion on which error recovery is performed. In some embodiments, the memory array is a DRAM array (e.g., with single-transistor, three-transistor, or other DRAM cells). In some embodiments, the memory array is a flash memory array (e.g., 3D NAND, 2D planar, etc.). The example of FIG. 1 will be referenced repeatedly herein in order to describe the disclosed techniques more clearly.

As shown in the example illustrated, memory cells are organized as wordlines along the horizontal direction (WL 0 through WL 3) and as bitlines along the vertical direction (BL 0 through BL 15). In some embodiments, the data in the wordlines is divided into multiple groups, with each group subject to ECC recovery using an ECC algorithm. In various embodiments, data within each ECC group has some internal correlation and can tolerate up to some specified maximum number of errors for which error recovery is possible with the ECC algorithm. In various embodiments, once the ECC format and its corresponding decoding schemes have been finalized, the specified maximum number of errors becomes fixed. Stated alternatively, if the error count in an ECC group (e.g., a wordline in memory portion 100) is less than the specified maximum number of errors, the data can be recovered with the ECC algorithm; otherwise, the whole chunk of data is uncorrectable using just the ECC algorithm.

In the example illustrated, the shaded locations represent memory cells with bit errors and the unshaded locations represent memory cells without bit errors. A faulty memory cell can produce an incorrect bit value when read (e.g., 0 instead of 1 or 1 instead of 0). By chance, a correct bit value may also be read if the faulty memory cell happens to store the correct bit. A non-fault memory cell always produces a correct bit value when read. In the specific example illustrated in FIG. 1, each wordline is an ECC group. Furthermore, suppose for this specific example, which is referenced throughout this disclosure, that the maximum number of errors in an ECC group for which error recovery is possible is 5. Thus, in the example illustrated, the data in WL 0, 1, and 2 are correctable using just an ECC algorithm because the number of memory cells with bit errors is less than or equal to 5 in each of these wordlines.

However, in the example illustrated, the data in WL 3 cannot be corrected using just the ECC algorithm because there are 6 memory cells with bit errors in WL 3, which exceeds the maximum number of errors that the ECC algorithm can handle per wordline (in this specific example). Therefore, using the ECC algorithm alone is not sufficient to remove all bit errors from memory portion 100. The example of FIG. 1 is diagrammatic and illustrative; memory portions on which error recovery is performed can include far more memory cells and the density of bit errors can be far lower. For example, wordlines can include tens of thousands of memory cells.

Figure 2:
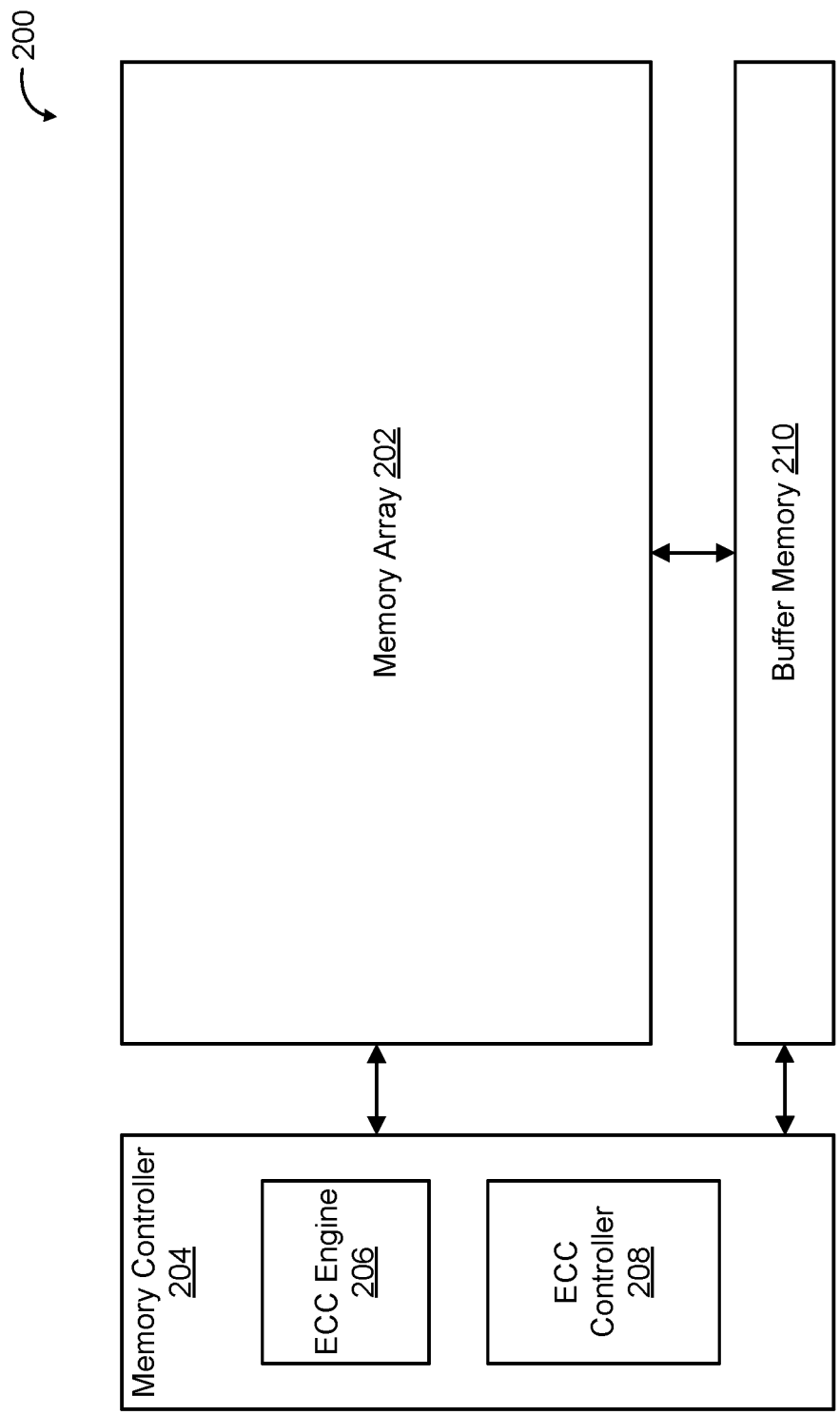
FIG. 2 is a block diagram illustrating an embodiment of a memory system incorporating memory recovery using error correlations.

FIG. 2 is a block diagram illustrating an embodiment of a memory system incorporating memory recovery using error correlations. Memory system 200 includes memory array 202 and memory controller 204. In some embodiments, memory portion 100 of FIG. 1 is included in memory array 202. In some embodiments, memory array 202 is a DRAM array (e.g., with single-transistor, three-transistor, or other DRAM cells). In some embodiments, memory array 202 is a flash memory array (e.g., 3D NAND, 2D planar, etc.). Memory controller 204 controls the flow of data to and from memory array 202. For example, in the case of a DRAM memory array, memory controller 204 includes digital logic necessary to read and write to DRAM and refresh DRAM.

In addition to basic functions such as reading and writing data, memory controller 204 includes memory error recovery functions. In the example illustrated, memory controller 204 includes ECC engine 206 and ECC controller 208. ECC engine 206 implements an ECC algorithm (e.g., an LDPC algorithm) that is capable of removing all errors from a data chunk (e.g., data chunks of memory portion 100 of FIG. 1) as long as the number of errors in the data chunk do not exceed a specified maximum number. ECC controller 208 can make calls to direct ECC engine 206 and is involved in removal of errors from data chunks for which ECC engine 206 alone is insufficient. For example, ECC engine 206 alone would not be sufficient to ensure error free use of WL 3 in memory portion 100 of FIG. 1 because the number of errors in WL 3 exceeds the specified maximum number of errors. In some embodiments, ECC controller 208 coordinates the memory error recovery techniques shown in FIGS. 3-7. In some embodiments, buffer memory 210 is used to copy error-filled data from memory array 202, temporarily store the error-filled data for analysis and correction by memory controller 204, and copy the corrected data back to memory array 202. In some embodiments, buffer memory 210 includes memory cells of the same type as those in memory array 202 (e.g., DRAM, flash memory, etc.). See FIGS. 3-7 for additional details on memory error correction mechanisms.

In the example illustrated, memory error correction mechanisms are implemented in memory controller 204. In some embodiments, memory controller 204 (and thus the memory error correction mechanisms) is implemented on an integrated circuit (e.g., hardcoded as an ASIC). It is also possible for the error correction mechanisms (e.g., ECC engine 206 and/or ECC controller 208) to be implemented separately from memory controller 204 and interface with memory controller 204. This can be the case if ECC engine 206 and/or ECC controller 208 are not hardcoded. For example, ECC engine 206 and/or ECC controller 208 may be implemented in reprogrammable firmware. In some embodiments, ECC engine 206 is implemented as an ASIC as a part of an existing memory controller and ECC controller 208 is implemented by modifying firmware for the memory controller. In embedded memory systems (e.g., embedded non-volatile memory), the memory error correction mechanisms may run on the same system on chip (SoC) where the embedded memory resides. ECC engine 206 and/or ECC controller 208 may also be implemented in software. A consequence of implementation in software (e.g., compared to an ASIC implementation) is reduced speed.

In the example illustrated in FIG. 2, portions of the communication path between the components are shown. Other communication paths may exist, and the example of FIG. 2 has been simplified to illustrate the example clearly. For example, communication channels transferring data between various components are not illustrated in full detail. In addition, memory controller 204 components for basic functions (e.g., reading, writing, and refreshing data) are not shown. Although single instances of components have been shown to simplify the diagram, additional instances of any of the components shown in FIG. 2 may exist. The number of components and the connections shown in FIG. 2 are merely illustrative. Components not shown in FIG. 2 may also exist. For example, modules of memory controller 204 associated with handling non-ECC related access to memory array 202 have been omitted to illustrate the example clearly.

Figure 3:
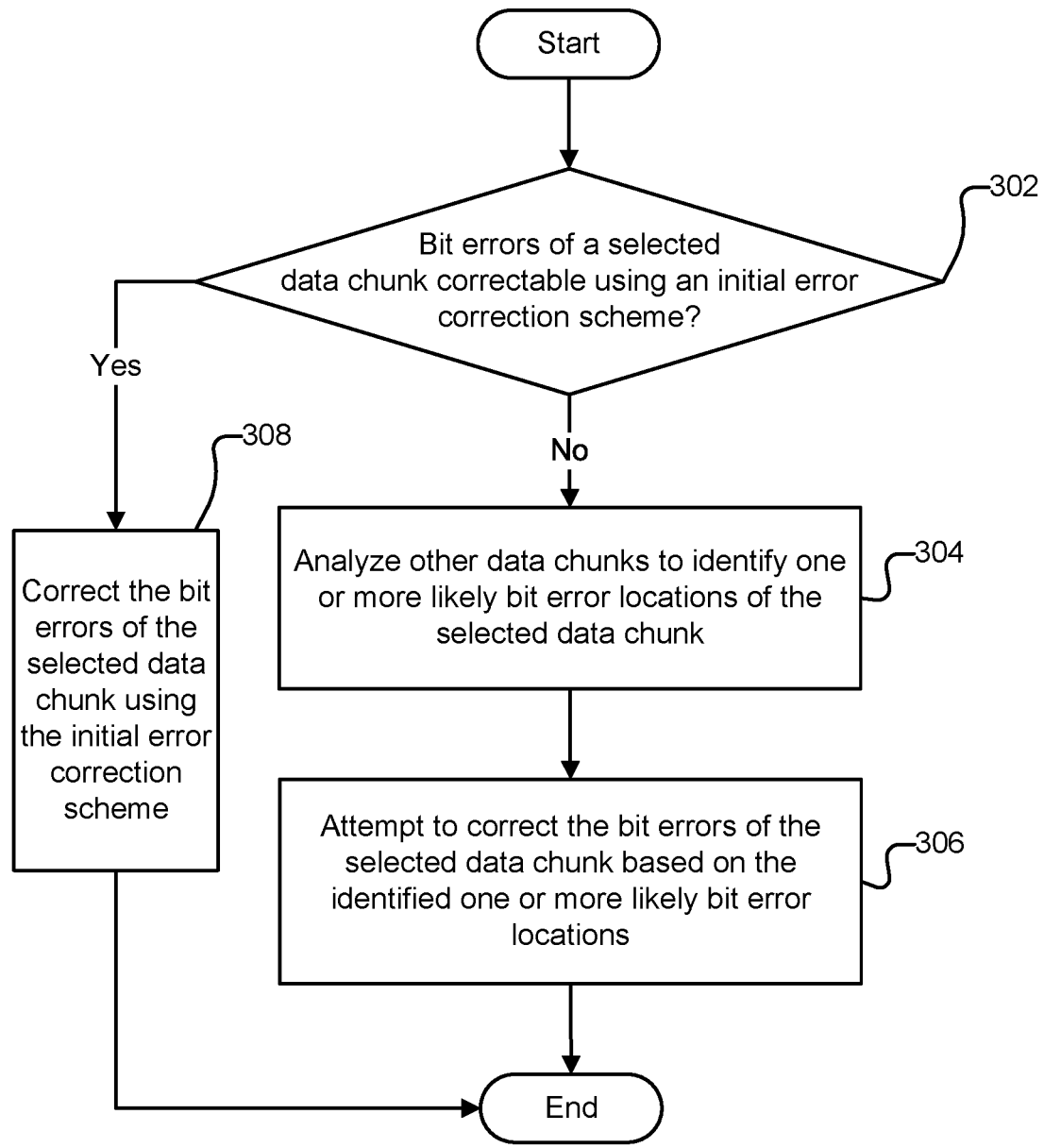
FIG. 3 is a flow chart illustrating an embodiment of a process for performing memory error recovery using error correlations.

FIG. 3 is a flow chart illustrating an embodiment of a process for performing memory error recovery using error correlations. In some embodiments, the process of FIG. 3 is performed by memory controller 204 of memory system 200 of FIG. 2.

At 302, it is determined whether bit errors of a selected data chunk can be corrected using an initial error correction scheme. If so, at 308, the bit errors of the selected data chunk are corrected using the initial error correction scheme. If at 302 it is determined that the bit errors of the selected data chunk cannot be corrected using the initial error correction scheme, then steps 304 and 306 are performed. In some embodiments, the selected data chunk is a wordline. It is also possible for the selected data chunk to be a portion of a wordline or some other data grouping. In various embodiments, the initial error correction scheme includes applying an ECC algorithm (e.g., LDPC) to the selected data chunk. The bit errors of the selected data chunk cannot be corrected if there are too many bit errors in the selected data chunk for the ECC algorithm to handle. For example, WL 3 of memory portion 100 of FIG. 1 cannot be corrected by just applying an ECC algorithm to WL 3 because there are too many bit errors in WL 3.

At 304, other data chunks are analyzed to identify one or more likely bit error locations of the selected data chunk. In various embodiments, a plurality of other data chunks sharing a physical layout structure element of the computer memory with the selected data chunk is analyzed to identify one or more likely bit error locations of the selected data chunk aligned with one or more corresponding bit error locations of a threshold number of the analyzed other data chunks. In some embodiments, the selected data chunk is a wordline and the other data chunks are neighboring wordlines. A bit error location of a wordline is aligned with corresponding bit error locations of neighboring wordlines if, for example, all the bit error locations occur along the same bitline. In some embodiments, the threshold number is a fixed number (e.g., one, two, or three errors in neighboring wordlines along the same bitline). BL 0, BL 5, and BL 11 of memory portion 100 of FIG. 1 are examples of multiple errors in neighboring wordlines along the same bitline. In memory portion 100 of FIG. 1, WL 3 is the data chunk that is uncorrectable using an initial error correction scheme (e.g., an ECC algorithm) and WL 0, WL 1, and WL 2 are neighboring wordlines that are analyzed to identify likely bit error locations in WL 3.

As shown in memory portion 100 of FIG. 1, defect bitline locations in an initially uncorrectable wordline (e.g., WL 3), which are typically unknown a priori, can be determined by analyzing neighboring wordlines (WL 0, WL 1, and WL 2 in this example). In the example of memory portion 100 of FIG. 1, WL 0, WL 1, and WL 2 can be corrected using the initial error correction scheme (e.g., the ECC algorithm) because they have fewer than 6 error bits (whereas WL 3 has 6 error bits). Thus, the memory cells with errors (shaded squares) in WL 0, WL 1, and WL 2 can be determined using the initial error correction scheme. This information can then be used to determine likely bit error locations in WL 3. For example, several consecutive error locations in neighboring wordlines along the same bitline indicates a defect bitline because, as described below, the probability of such a pattern of errors occurring randomly is very low.

Errors in memory can be classified as random errors and stuck permanent errors. Random errors can occur at any location in the memory but happen with low probability, e.g., 0.1% for flash memory and even lower for DRAM and other memory types, such as magnetoresistive random-access memory (MRAM), phase-change memory (PCM), etc. Stuck permanent errors occur at defect cells, defect bitlines, etc. In some scenarios, if random data is programmed, the error probability in these defect cells or defect bitlines can be approximately 50%. The chance of two or three consecutive random errors occurring along the same bitline would be very low (e.g., $(0.1\%)^2=10^{-6}$ and $(0.1\%)^3=10^{-9}$ respectively for flash memory, and even lower for DRAM), but the chance of a similar number of stuck permanent errors is much higher. In the example of memory portion 100 of FIG. 1, the three consecutive bitline errors along BL 0, BL 5, and BL 11 on WL 0, WL 1, and WL 2 indicate that there is a high chance of error at the BL0, BL 5, and BL 11 locations on WL 3 (due to bitline defects) because the probabilities of such patterns of errors for WL 0, WL 1, and WL 2 occurring randomly are extremely low (e.g., approximately $10^{-9}$ for flash memory and even lower for DRAM). As it turns out in the example of memory portion 100 of FIG. 1, there are indeed errors at the BL 5 and BL 11 locations on WL3.

Different thresholds can be set for the number of neighboring locations with errors to make a determination that the corresponding location in the selected data chunk likely has an error. For example, the threshold could be three consecutive bitline errors (as shown in memory portion 100 of FIG. 1), two consecutive bitline errors, 50% errors in a specified number of neighboring wordlines (e.g., 50% errors in 10 neighboring wordlines), two bitline errors within a three-wordlines range, two bitline errors within a five-wordlines range, three bitline errors within a ten-wordlines range, etc. Note that it is possible that some neighboring wordlines cannot be analyzed because they are also not correctable with the initial correction scheme. But they do not need to be corrected if the threshold is a percentage of errors in a specified number of neighboring wordlines (e.g., 50% errors in 10 neighboring wordlines) that can be reached based on correctable neighboring wordlines. In addition, the initially uncorrectable neighboring wordlines can be corrected using the same technique used to correct the selected data chunk (e.g., wordline). Stated alternatively, any initially uncorrectable neighboring wordline can be corrected by analyzing its neighbors. As more and more wordlines in a memory portion are corrected, more and more of these corrected wordlines become neighboring wordlines that can be used to correct other wordlines in the memory portion.

Bitline errors can be caused by manufacturing defects. For example, for 3D NAND flash memory, in which memory cells are stacked vertically in multiple layers and each layer can correspond to a different wordline, a vertical cavity or component manufacturing defect can extend across multiple wordlines, causing an entire bitline or a continuous portion of a bitline to be faulty (e.g., permanently stuck at a 0 or 1 value). In addition, flash memory bitline defects can be caused by overprogramming (e.g., applying a high voltage to memory cells across multiple wordlines). The overprogramming can increase threshold voltages of memory cells, causing them to be stuck at a 0 value. Various other causes for bitline errors also exist. Memory cells can become stuck on a value (0 or 1), have other defects that result in random errors, etc.

In some embodiments, an ECC engine (e.g., ECC engine 206 of FIG. 2) implements an ECC algorithm (e.g., LDPC) that is used to attempt to correct wordlines. In various embodiments, to correct a wordline that is not at first correctable with the ECC engine, the wordline that is not at first correctable and with its neighboring wordlines, are read into buffer memory (e.g., buffer memory 210 of FIG. 2). The neighboring wordlines can then be analyzed (e.g., using ECC controller 208 of FIG. 2 in conjunction with ECC engine 206 of FIG. 2) to determine defect bitlines. Wordlines in the same data chunk will share bitlines (e.g., for flash memory, which is divided into blocks, wordlines in the same block will have the same bitlines). The memory controller (e.g., memory controller 204 of FIG. 2) has wordline and bitline location and mapping information (e.g., stored in a scramble table that has logical and physical mappings).

At 306, an attempt is made to correct the bit errors of the selected data chunk based on the identified one or more likely bit error locations. In some embodiments, the selected data chunk is a wordline with more than a specified maximum number of errors that an ECC algorithm can correct. For example, WL 3 of memory portion 100 of FIG. 1 is one such wordline. As described above, for WL 3 of memory portion 100 of FIG. 1, the identified one or more likely bit error locations are the BL 0, BL 5, and BL 11 locations. In various embodiments, the attempt to correct the bit errors is performed on a copy of the selected data chunk stored in buffer memory (e.g., buffer memory 210 of FIG. 2).

As described in further detail herein (e.g., see FIG. 6), if a soft-decoding ECC algorithm (e.g., LDPC) is used (e.g., by ECC engine 206 of FIG. 2), the likely bit error locations can be fed to the soft-decoding ECC algorithm, which can use the likely bit error locations to increase the likelihood of successful decoding. Also, as described in further detail herein (e.g., see FIG. 7), if a hard-decoding ECC algorithm is used (e.g., by ECC engine 206 of FIG. 2), bits in the likely bit error locations can be flipped in various combinations (to reduce the number of bit errors to or below the specified maximum number of errors) and then the ECC algorithm can be triggered again. In various embodiments, if successful, a corrected version of the selected data chunk is copied from buffer memory (e.g., buffer memory 210 of FIG. 2) back to the memory array (e.g., memory array 202 of FIG. 2) that stores the selected data chunk to overwrite the error-filled version of the selected data chunk.

The techniques disclosed herein are generally applicable as long as there is an error correlation between neighboring data chunks along a shared structural element. Flash memory (e.g., vertical flash, planar flash, etc.) and DRAM with wordline/bitline architectures are specific examples. In general, neighboring data chunks do not necessarily need to be neighboring wordlines, and the shared structural element does not necessarily need to be a bitline. The techniques disclosed herein are beneficial because they improve memory reliability, performance, and cost. Reliability is improved because unrecoverable error scenarios are reduced for a given memory array. The improved reliability can be used to increase performance by allowing for more bits to be stored at the same level of reliability. Cost can also be reduced by allowing for denser storage (resulting in lower cost per unit of space) at the same level of reliability. The techniques disclosed herein are particularly beneficial as the current trend is for memories to become denser, which results in bit error failures that ECC algorithms cannot correct to occur with greater frequency.

Figure 4:
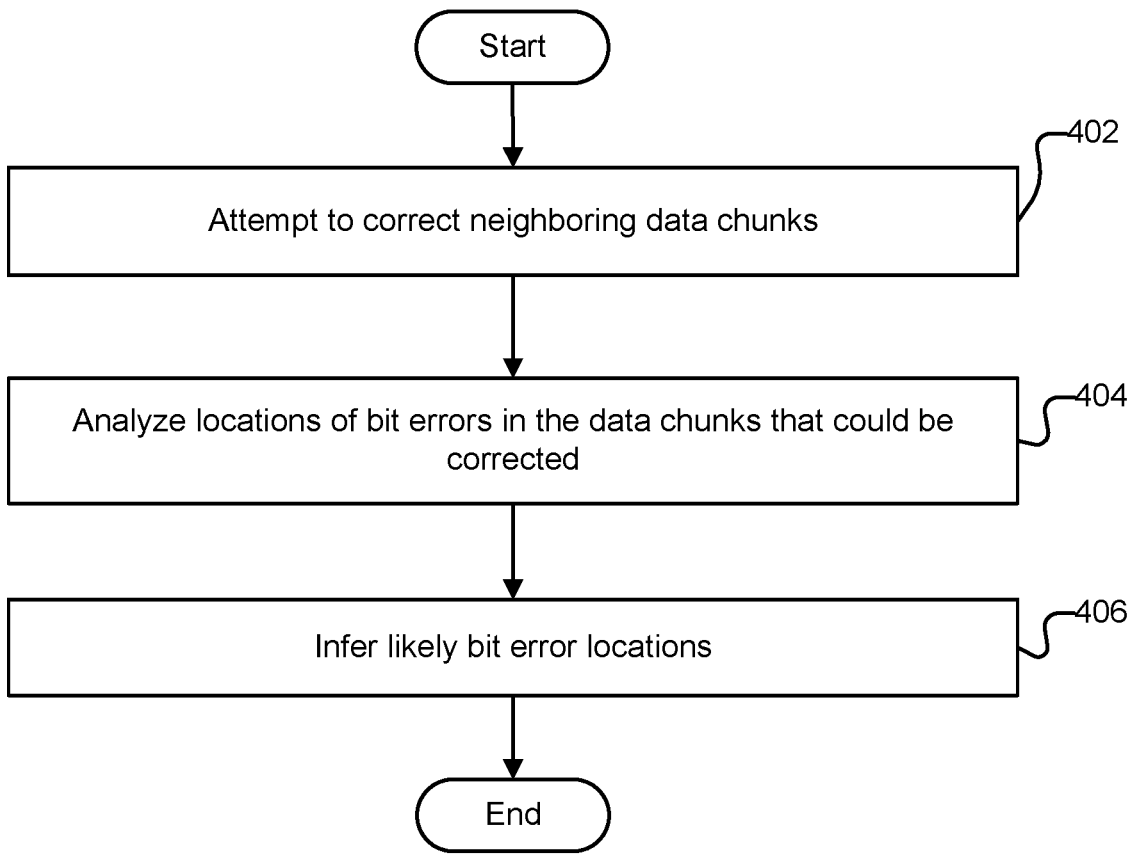
FIG. 4 is a flow chart illustrating an embodiment of a process for identifying likely bit error locations.

FIG. 4 is a flow chart illustrating an embodiment of a process for identifying likely bit error locations. In some embodiments, the process of FIG. 4 is performed by memory controller 204 of memory system 200 of FIG. 2. In some embodiments, at least a portion of the process of FIG. 4 is performed in 304 of FIG. 3. In various embodiments, the likely bit error locations are identified for a selected data chunk (e.g., a selected wordline) as described in 304 of FIG. 3.

At 402, attempts are made to correct neighboring data chunks. Neighboring data chunks can refer to data chunks (e.g., wordlines) within a specified vicinity as well as directly adjacent locations. In various embodiments, neighboring wordlines, which share the same bitlines with the selected data chunk are read. For example, for data failure associated with WL 3 of memory portion 100 of FIG. 1, WL 0, WL 1, and WL 2 of memory portion 100 are read, after which, an ECC algorithm (e.g., implemented in ECC engine 206 of FIG. 2) can be applied to these neighboring wordlines. Stated alternatively, attempts are made to correct these neighboring wordlines using an ECC algorithm. Neighboring wordlines that are not correctable can be ignored for the moment (and another attempt to correct them can be made later after their neighboring wordlines are corrected). A consequence of correcting the neighboring wordlines is determining error location information (e.g., bitline locations within the neighboring wordlines where errors were corrected). In some embodiments, ECC controller 208 of FIG. 2 calls ECC engine 206 of FIG. 2 to perform error correction and then stores the corrected error locations.

At 404, locations of bit errors in the data chunks that could be corrected are analyzed. For example, the bitline locations in the corrected neighboring wordlines can be analyzed. In some embodiments, ECC controller 208 of FIG. 2 performs this analysis. If the same bitlines in a threshold number of neighboring data chunks have errors, then it is likely that those bitlines have defects. As described above with respect to FIG. 3, the random error probability is low (e.g., approximately 0.1% for flash memory or even lower for other memory types) at each bit location; thus, the probability of 2 random errors in the same local region would be very low (e.g., approximately $10^{-6}$ or lower) and the probability of 3 random errors in the same local region would be extremely low (e.g., approximately $10^{-6}$ or lower).

At 406, likely bit error locations are inferred. In some embodiments, this inference is performed by ECC controller 208 of FIG. 2. In various embodiments, the inference of likely bit error locations is based on detecting corresponding bit error locations of a threshold number of the analyzed neighboring data chunks (e.g., neighboring wordlines). Because, as described above, the probability of multiple random errors in the same local region along a bitline is low, it can be inferred that multiple errors (e.g., 2 or 3) in the same local region along a bitline are due to a bitline defect. Because a bitline defect is inferred, it can also be inferred that the corresponding bitline location in the selected data chunk (e.g., selected wordline) is a likely bit error location. By looking at the common error locations of data in the neighboring wordlines, defect bitline locations can be inferred with high confidence.

In the example of memory portion 100 of FIG. 1, if a likely bit error location can be inferred based on two or more bit errors in the same local region along a bitline, then the BL 0, BL 5, and BL 11 locations in WL 3 are likely bit error locations because BL 0, BL 5, and BL 11 have bit errors in neighboring wordlines WL 0, WL 1, and WL 2. In memory portion 100 of FIG. 1, none of the other bitlines have more than one error in neighboring wordlines WL 0, WL 1, and WL 2. In the example of memory portion 100 of FIG. 1, there are indeed bit errors at the BL 5 and BL 11 locations on WL 3. A likely bit error location may have a bit error likelihood of approximately 50% (much higher than the random error probabilities listed above). In the example of memory portion 100 of FIG. 1, the BL 0 location on WL 3 stores the correct bit. That memory cell may still be faulty but stores the correct bit through chance or it may be a non-faulty memory cell. As described in further detail below (e.g., see FIGS. 6 and 7), the likely bit error locations are fed to decoding schemes. It is not known before decoding whether each likely bit error location actually has an error (e.g., the BL 5 and BL 11 locations on WL 3) or does not have an error (e.g., the BL 0 location on WL 3). Nonetheless, these likely bit error locations are useful because the likelihood of errors in these locations (e.g., approximately 50%) is much greater than the likelihood of random errors (e.g., 0.1% or lower). This additional information improves the chances of successful memory recovery (e.g., by using an ECC algorithm incorporating this additional information).

Figure 5:
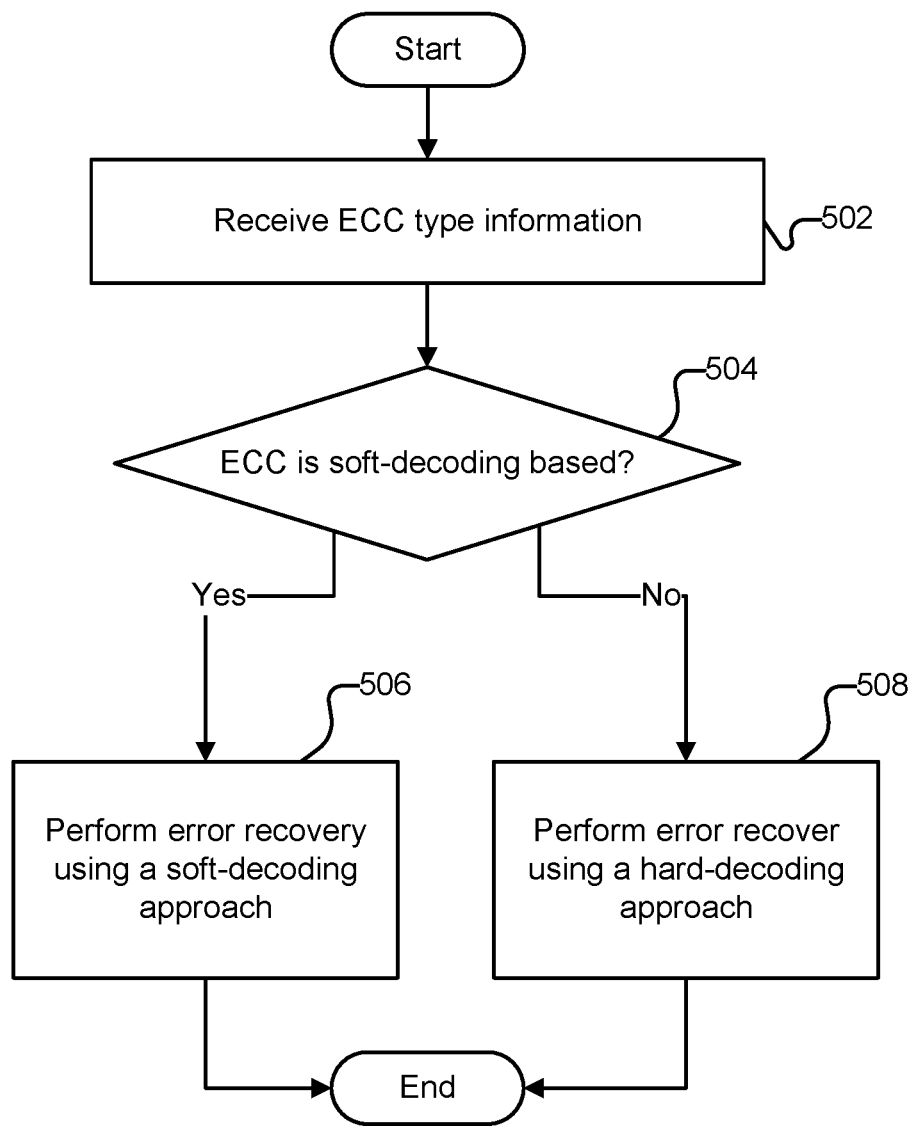
FIG. 5 is a flow chart illustrating an embodiment of a process for selecting a decoding scheme to correct bit errors in a selected data chunk.

FIG. 5 is a flow chart illustrating an embodiment of a process for selecting a decoding scheme to correct bit errors in a selected data chunk. In some embodiments, the process of FIG. 5 is performed by memory controller 204 of FIG. 2. In some embodiments, at least a portion of the process of FIG. 5 is performed in 306 of FIG. 3.

At 502, ECC type information is received. For example, the type of ECC algorithm utilized by ECC engine 206 of FIG. 2 may be received. A soft-decoding ECC algorithm (e.g., LDPC) may be used. Soft decoding refers to decoding in which data is decoded based at least in part on probabilistic information concerning data values. Hard decoding refers to decoding in which data is decoded without using such probabilistic information. In some embodiments, an ECC engine (e.g., ECC engine 206 of FIG. 2) implements one type of decoding. It is also possible for the ECC engine to implement both soft decoding and hard decoding as well as multiple variants of each.

At 504, it is determined whether a soft-decoding based ECC algorithm is to be used to correct a selected data chunk. If so, at 506, error recovery is performed using a soft-decoding approach. In various embodiments, the soft-decoding approach includes adjusting probabilistic information associated with data in the selected data chunk. For example, with LDPC, a log likelihood ratio (LLR) of zero can be specified for each bit in a likely bit error location (corresponding to zero confidence that the bit is more likely to be a 0 or a 1). This means 0 and 1 are equally likely, as would be the pure chance case without the benefit of any probabilistic knowledge. See FIG. 6 for additional details. If at 504 it is determined that soft decoding will not be used, at 508, error recovery is performed using a hard-decoding approach. In various embodiments, the hard-decoding approach includes selective bit flipping (e.g., see FIG. 7). Soft-decoding schemes can also use bit flipping that is built into the soft-decoding schemes and not directly controllable by an ECC controller (e.g., ECC controller 208 of FIG. 2).

In some embodiments, a hard-decoding approach is attempted if the soft-decoding approach fails. As described with respect to FIG. 7, a hard-decoding approach can remove all permanent defect errors at defect bitlines if unlimited time is available to run a hard-decoding algorithm. In this scenario, memory recovery would only fail if the number of random errors exceeds the maximum number of errors the hard-decoding algorithm can handle.

Figure 6:
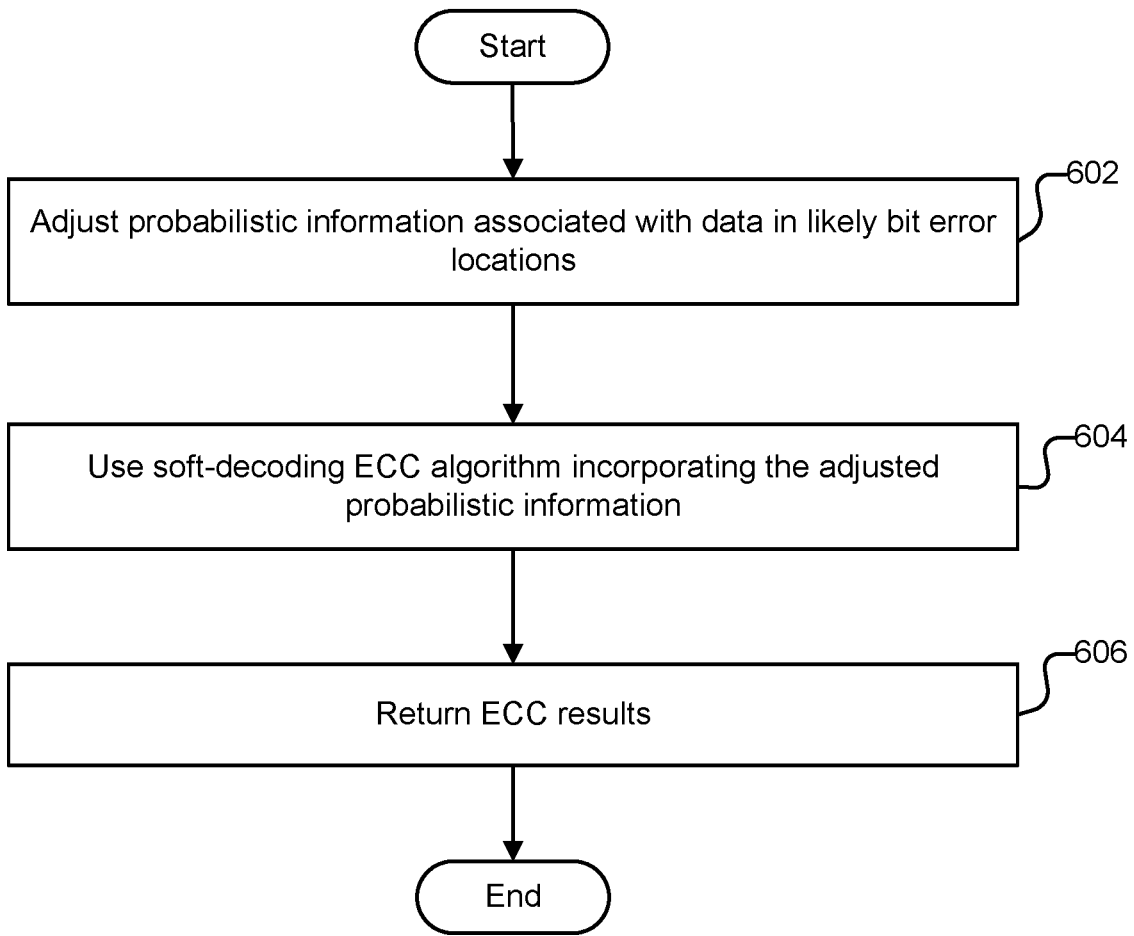
FIG. 6 is a flow chart illustrating an embodiment of a process for performing bit error correction using soft decoding.

FIG. 6 is a flow chart illustrating an embodiment of a process for performing bit error correction using soft decoding. In some embodiments, the process of FIG. 6 is performed by memory controller 204 of FIG. 2. In some embodiments, at least a portion of the process of FIG. 6 is performed in 506 of FIG. 5.

At 602, probabilistic information associated with data in likely bit error locations is adjusted. In some embodiments, ECC controller 208 of FIG. 2 performs this adjustment. In various embodiments, likely bit error locations in a selected data chunk are identified as a result of correcting data chunks that neighbor the selected data chunk (e.g., see FIG. 4). For example, with LDPC, log likelihood ratios can be set to zero (LLR=0) for bits in likely bit error locations (meaning that 1 and 0 are expected with equal probability). Other bit locations can keep whatever LLR values they had, e.g., +7, +3, etc. (0 more likely than 1) and −7, −3, etc. (1 more likely than 0). Adjusting probabilistic information associated with data in likely bit error locations removes incorrect confidence information, which increases the error correction capability of the ECC algorithm that is being used to correct data chunks.

At 604, a soft-decoding ECC algorithm incorporating the adjusted probabilistic information is used. In some embodiments, the soft-decoding ECC algorithm (e.g., LDPC) is implemented in ECC engine 206 of FIG. 2. By incorporating improved probabilistic information (e.g., improved LLR values), the ECC algorithm is more likely to be able to correct the selected data chunk. In some embodiments, the soft-decoding ECC algorithm operates on a copy of the selected data chunk stored in buffer memory (e.g., buffer memory 210 of FIG. 2).

At 606, ECC results are returned. In some embodiments, ECC controller 208 of FIG. 2 returns the results. In some embodiments, if error correction is successful, a corrected version of the selected data chunk is copied from buffer memory (e.g., buffer memory 210 of FIG. 2) into the memory array (e.g., memory array 202 of FIG. 2) storing the original version of the selected data chunk to overwrite the original version of the selected data chunk. It is also possible to selectively overwrite just the error bits with corrected bits. If error correction is not successful, a "no success" status result is returned. It is also possible for a "timeout" result to be returned if the ECC algorithm exceeds a specified correction time budget (e.g., a 1 millisecond time budget for non-critical applications). The timeout event can also be specified in terms of a number of iterations (e.g., if each iteration takes 10 microseconds, a timeout after 100 iterations is the equivalent of a 1 millisecond timeout). The time budget can be adjusted. For example, for critical applications, an unlimited time budget (or a very large time budget) may be specified. In some embodiments, ECC details (e.g., number of iterations attempted) are reported.

Figure 7:
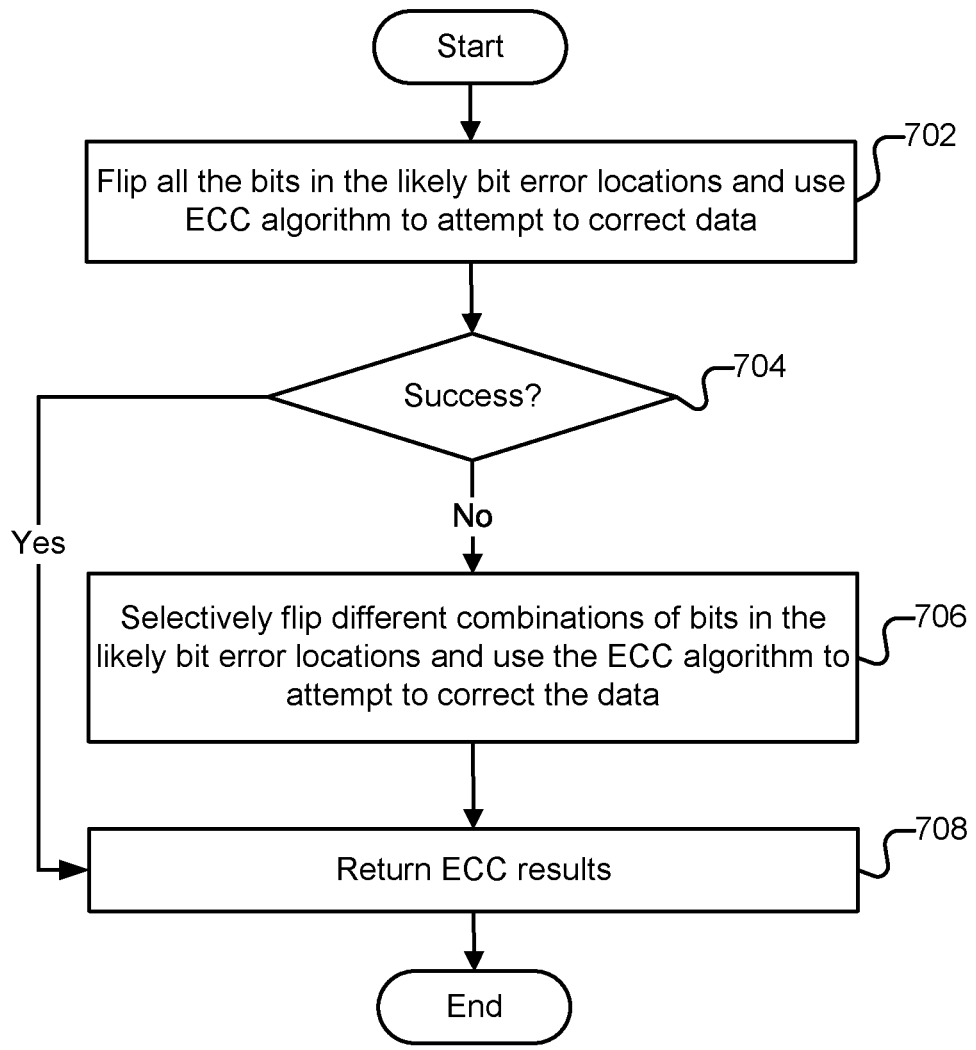
FIG. 7 is a flow chart illustrating an embodiment of a process for performing bit error correction using hard decoding.

FIG. 7 is a flow chart illustrating an embodiment of a process for performing bit error correction using hard decoding. In some embodiments, the process of FIG. 7 is performed by memory controller 204 of FIG. 2. In some embodiments, at least a portion of the process of FIG. 7 is performed in 508 of FIG. 5.

At 702, all bits in the likely bit error locations are flipped and a hard-decoding based ECC algorithm is used to attempt to correct data in a selected data chunk. With a hard-decoding based ECC algorithm, an ECC engine (e.g., ECC engine 206 of FIG. 2) predicts each bit in the selected data chunk to be either a 1 or a 0 (instead of a probability as is the case with soft-decoding based ECC algorithms). In some embodiments, ECC controller 208 of FIG. 2 performs the bit flipping. In some embodiments, the hard-decoding ECC algorithm operates on a copy of the selected data chunk stored in buffer memory (e.g., buffer memory 210 of FIG. 2). In various embodiments, likely bit error locations in a selected data chunk are identified as a result of correcting data chunks that neighbor the selected data chunk (e.g., see FIG. 4). For example, in memory portion 100 of FIG. 1, as described above, the likely bit error locations in WL 3 are at BL 0, BL 5, and BL 11. After flipping these bits, the number of errors in WL 3 are reduced from 6 to 5 (the BL 5 and BL 11 bits no longer in error but a new error is introduced at BL 0). This reduces the number of errors in WL 3 to the maximum number of errors for which memory recovery of a wordline is possible in the specific example illustrated in FIG. 1. Thus, in this specific example, after flipping all bits in the likely bit error locations, attempting ECC memory recovery would result in successful memory recovery.

In general, assume the selected data chunk includes x random errors and y permanent defect errors at defect bitlines, resulting in a total error count of x+y that is greater than a maximum number of errors T correctable with an ECC algorithm. Assume K defect bitlines are identified and the errors within the K defect bitlines are k (k being less than K but close to K). If the bit values in the K identified defect bitlines are flipped, the remaining errors will be x+(y−k)+ (K−k). With k being close in value to K (since these locations are defect bitlines), the remaining errors will be approximately equal to x+y−k (the total errors reduced by k). If x+y−k is less than or equal to T, then memory recovery will be successful.

At 704, it is determined whether flipping all the bits in the likely bit error locations and using the ECC algorithm results in successful memory recovery. If so, at 708, ECC results are returned. If flipping all the bits in the likely bit error locations does not result in successful memory recovery, at 706, different combinations of bits in the likely bit error locations are selectively flipped and the hard-decoding based ECC algorithm is used after each instance of bit flipping. For example, 1 bit, 2 bits, and so forth up to K bits (if K defect bitlines are identified) can be selectively flipped. There are up to $2^K-1$ different combinations of bit flips to attempt ($2^K$ bit combinations for K bits and excluding the case of not flipping any bits). After this maximum number of attempts, there will be at least one instance of bit flipping that reduces the total error count to x+y−k (note: there is exactly one combination of bit flips that will reduce the error count to x+y, corresponding to removing all k errors within the K identified defect bitlines). In some embodiments, ECC controller 208 of FIG. 2 performs the bit flipping.

It is also possible for a "timeout" to occur if the ECC algorithm exceeds a specified correction time budget (e.g., a 1 millisecond time budget for non-critical applications). The timeout event can also be specified in terms of a number of iterations, wherein each iteration corresponds to an instance of bit flipping and ECC algorithm application. For example, if each iteration takes 10 microseconds, a timeout after 100 iterations is the equivalent of a 1 millisecond timeout. The time budget can be adjusted. For example, for critical applications, an unlimited time budget (or a very large time budget) may be specified. In many scenarios, K is small (e.g., less than 10 for any particular ECC group). In these scenarios, successful memory recovery within the specified correction time budget is more probable. No correction time budget is needed for the initial correction attempt at 702 involving flipping all the bits in the likely bit error locations because only one combination of bit flips is attempted.

At 708, ECC results are returned. In some embodiments, ECC controller 208 of FIG. 2 returns the results. In some embodiments, if error correction is successful, a corrected version of the selected data chunk is copied from buffer memory (e.g., buffer memory 210) into the memory array (e.g., memory array 202 of FIG. 2) storing the original version of the selected data chunk to overwrite the original version of the selected data chunk. It is also possible to selectively overwrite just the error bits with corrected bits. If error correction is not successful (e.g., due to a timeout event occurring at 706), a "no success" status result is returned. In some embodiments, ECC details (e.g., number of iterations attempted) are reported.

Although the foregoing embodiments have been described in some detail for purposes of clarity of understanding, the invention is not limited to the details provided. There are many alternative ways of implementing the invention. The disclosed embodiments are illustrative and not restrictive.

What is claimed is:

1. A method, comprising:
    determining that bit errors of a selected data chunk stored in a computer memory are unable to be completely corrected using an initial error correction scheme;
    analyzing a plurality of other data chunks sharing a physical layout structure element of the computer memory with the selected data chunk to identify one or more likely bit error locations of the selected data chunk aligned with one or more corresponding bit error locations of a threshold number of the analyzed other data chunks, wherein analyzing the plurality of other data chunks to identify the one or more likely bit error locations includes applying the initial error correction scheme to one or more of the other data chunks and analyzing outputs from the application of the initial error correction scheme to the one or more other data chunks; and
    attempting to correct the bit errors of the selected data chunk based on the identified one or more likely bit error locations of the selected data chunk.

2. The method of claim 1, wherein the selected data chunk is a wordline or a portion of a wordline in the computer memory.

3. The method of claim 1, wherein the physical layout structure element is a bitline or a portion of a bitline in the computer memory.

4. The method of claim 1, wherein the computer memory is a dynamic random-access memory.

5. The method of claim 1, wherein the computer memory is a flash memory.

6. The method of claim 1, wherein the initial error correction scheme is a soft-decoding error correction code scheme.

7. The method of claim 1, wherein attempting to correct the bit errors of the selected data chunk includes adjusting probabilistic information associated with data in the identified one or more likely bit error locations of the selected data chunk and applying the initial error correction scheme, with the adjusted probabilistic information incorporated, to the selected data chunk.

8. The method of claim 1, wherein the initial error correction scheme is a hard-decoding error correction code scheme.

9. The method of claim 1, wherein attempting to correct the bit errors of the selected data chunk includes flipping every bit in the identified one or more likely bit error locations of the selected data chunk and applying the initial error correction scheme to the selected data chunk with every bit in the identified one or more likely bit error locations of the selected data chunk flipped.

10. The method of claim 9, wherein in response to a determination that the bit errors of the selected data chunk, with every bit in the identified one or more likely bit error locations of the selected data chunk flipped, are unable to be completely corrected, one or more attempts are made to correct the bit errors of the selected data chunk by selectively flipping a subset of bits in the identified one or more likely bit error locations of the selected data chunk per attempt and applying the initial error correction scheme to the selected data chunk with the subset of bits in the identified one or more likely bit error locations of the selected data chunk flipped.

11. The method of claim 10, wherein the attempts to correct the bit errors of the selected data chunk by selectively flipping subsets of bits are continued until one of the following events occurs: the bit errors of the selected data chunk are completely corrected, a specified amount of time has elapsed, or a determination is made that the bit errors of the selected data chunk are unable to be completely corrected after every possible subset of bits in the identified one or more likely bit error locations of the selected data chunk has been flipped.

12. The method of claim 1, wherein the initial error correction scheme is implemented in a memory controller that is hardcoded as an application-specific integrated circuit.

13. The method of claim 1, wherein the physical layout structure element has a physical defect affecting at least a portion of the plurality of other data chunks.

14. The method of claim 13, wherein the physical defect causes memory cells in the computer memory to be stuck on a zero bit or a one bit.

15. The method of claim 1, wherein the threshold number of the analyzed other data chunks is a specified number.

16. The method of claim 1, wherein the threshold number of the analyzed other data chunks is associated with a specified percentage of the other data chunks within a specified physical proximity to the selected data chunk.

17. The method of claim 1, further comprising copying the selected data chunk and the plurality of other data chunks to a buffer memory.

18. A system, comprising:
a processor configured to:
    determine that bit errors of a selected data chunk stored in a computer memory are unable to be completely corrected using an initial error correction scheme;
    analyze a plurality of other data chunks sharing a physical layout structure element of the computer memory with the selected data chunk to identify one or more likely bit error locations of the selected data chunk aligned with one or more corresponding bit error locations of a threshold number of the analyzed other data chunks, including by being configured to apply the initial error correction scheme to one or more of the other data chunks and analyze outputs from the application of the initial error correction scheme to the one or more other data chunks; and
    attempt to correct the bit errors of the selected data chunk based on the identified one or more likely bit error locations of the selected data chunk; and
a memory coupled to the processor and configured to provide the processor with instructions.

19. A computer program product, the computer program product being embodied in a non-transitory computer readable storage medium and comprising computer instructions for:
    determining that bit errors of a selected data chunk stored in a computer memory are unable to be completely corrected using an initial error correction scheme;
    analyzing a plurality of other data chunks sharing a physical layout structure element of the computer memory with the selected data chunk to identify one or more likely bit error locations of the selected data chunk aligned with one or more corresponding bit error locations of a threshold number of the analyzed other data chunks, wherein analyzing the plurality of other data chunks to identify the one or more likely bit error locations includes applying the initial error correction scheme to one or more of the other data chunks and analyzing outputs from the application of the initial error correction scheme to the one or more other data chunks; and
    attempting to correct the bit errors of the selected data chunk based on the identified one or more likely bit error locations of the selected data chunk.

20. The computer program product of claim 19, wherein the selected data chunk is a wordline or a portion of a wordline in the computer memory.

* * * * *